(12) United States Patent
Hou et al.

(10) Patent No.: US 8,975,571 B2
(45) Date of Patent: Mar. 10, 2015

(54) OFF-AXIAL THREE-MIRROR SYSTEM

(71) Applicants: Wei Hou, Beijing (CN); Jun Zhu, Beijing (CN); Guo-Fan Jin, Beijing (CN); Shou-Shan Fan, Beijing (CN)

(72) Inventors: Wei Hou, Beijing (CN); Jun Zhu, Beijing (CN); Guo-Fan Jin, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 271 days.

(21) Appl. No.: 13/712,961

(22) Filed: Dec. 12, 2012

(65) Prior Publication Data
US 2014/0124649 A1 May 8, 2014

(30) Foreign Application Priority Data

Nov. 6, 2012 (CN) .......................... 2012 1 0437743

(51) Int. Cl.
*G02B 17/06* (2006.01)
*H01L 27/148* (2006.01)
(52) U.S. Cl.
CPC ...... *H01L 27/14825* (2013.01); *G02B 17/0621* (2013.01); *G02B 17/0642* (2013.01)
USPC .......................... 250/208.1; 250/216; 359/858

(58) Field of Classification Search
USPC ............................... 250/208.1, 216; 359/858
See application file for complete search history.

(56) References Cited

U.S. PATENT DOCUMENTS

| | | | | | |
|---|---|---|---|---|---|
| 3,085,565 | A | * | 4/1963 | MacCauley | 126/680 |
| 3,950,079 | A | * | 4/1976 | Rambauske | 359/226.1 |
| 4,050,775 | A | * | 9/1977 | Scholten | 359/728 |
| 6,616,287 | B2 | * | 9/2003 | Sekita et al. | 359/858 |
| 2012/0038812 | A1 | | 2/2012 | Neil | |

* cited by examiner

*Primary Examiner* — Tony Ko
(74) *Attorney, Agent, or Firm* — Novak Druce Connolly Bove + Quigg LLP

(57) ABSTRACT

An off-axial three-mirror system includes a primary mirror, a secondary mirror, a tertiary mirror, and an image sensor. The secondary mirror is located on a reflective optical path of the primary mirror. The tertiary mirror is located on a reflective optical path of the secondary mirror. The image sensor is located on a reflecting optical path of the tertiary mirror. The primary mirror and the tertiary mirror are formed as one piece. The surface type of both the primary mirror and the tertiary mirror is a freeform surface. The primary mirror is a convex mirror, and the tertiary mirror is a concave mirror.

19 Claims, 6 Drawing Sheets

OFF-AXIAL THREE-MIRROR SYSTEM

CROSS-REFERENCE TO RELATED APPLICATIONS

This application claims all benefits accruing under 35 U.S.C. §119 from China Patent Application No. 201210437743.6, filed on Nov. 6, 2012 in the China Intellectual Property Office. This application is also related to application entitled, "OFF-AXIAL THREE-MIRROR SYSTEM", filed Dec. 12, 2012 (Ser. No. 13/712,960). Disclosures of the above-identified applications are incorporated herein by reference.

BACKGROUND

1. Technical Field

The present disclosure relates to all-reflective optical systems, and particularly to an off-axial three-mirror system.

2. Description of Related Art

All-reflective optical systems have long been the champions of the astronomical community, primarily because of their small size, lightweight construction and broad spectral coverage. One type of all-reflective optical systems is an off-axial three-mirror system, which includes a primary mirror, a secondary mirror, and a tertiary mirror.

In some related art, spherical mirrors and conicoid mirrors such as ellipsoidal mirrors, parabolic mirrors, and hyperbolic mirrors are employed in the off-axial three-mirror system. There are not many degrees of freedom in said mirrors that the off-axial three-mirror system cannot provide a superior performance in imaging.

Another problem in some related art is the assembling and aligning of the mirrors, for the primary mirror, the secondary mirror, and the tertiary mirror in the off-axial three-mirror system are all separate from each other.

What is needed, therefore, is to provide an off-axial three-mirror system, in which the mirrors have more degrees of freedom, and the mirrors are easier to be assembled and aligned.

BRIEF DESCRIPTION OF THE DRAWINGS

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
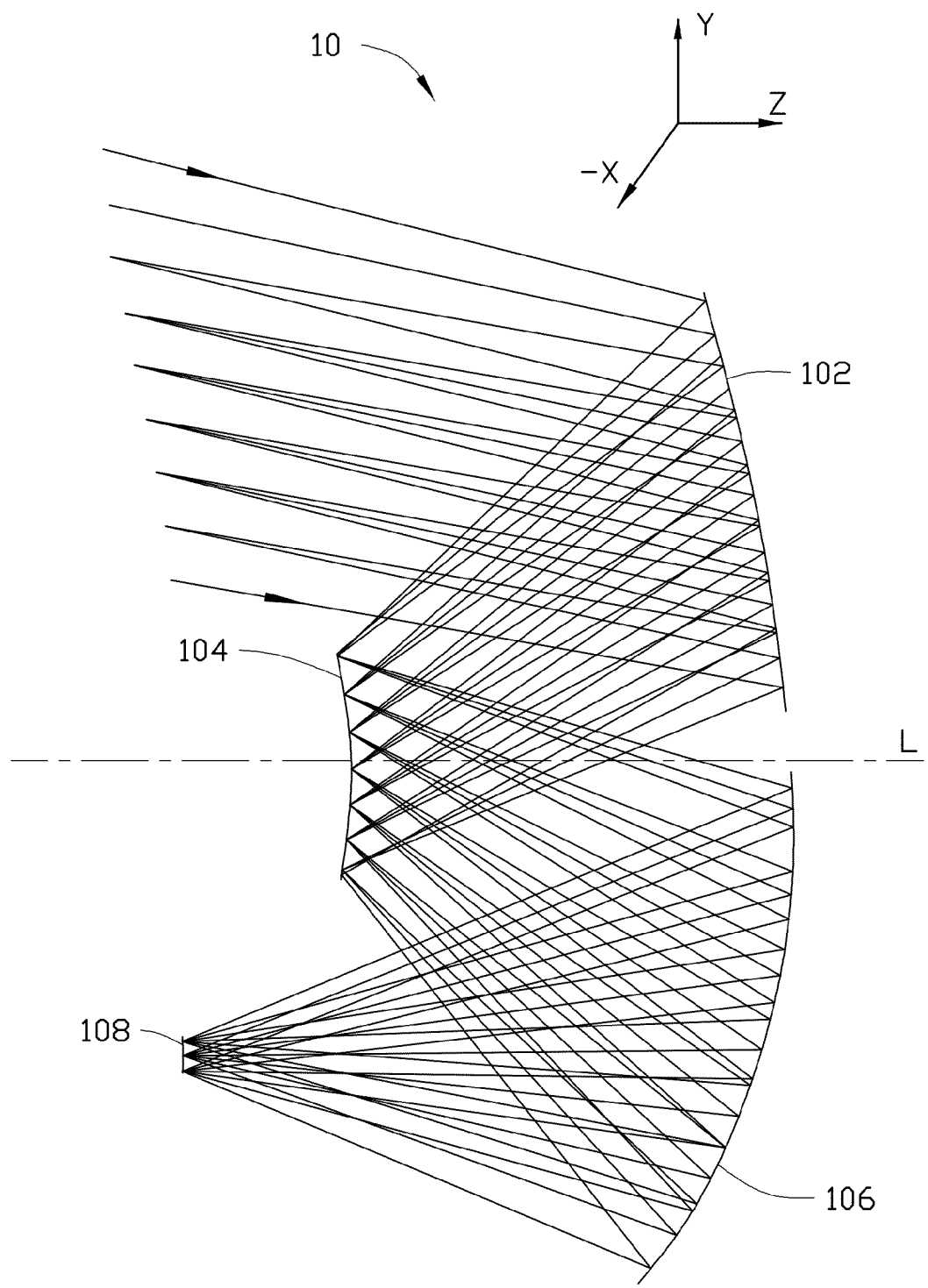
FIG. 1 is a diagram of optical path of an off-axial three-mirror system according to one embodiment.
Figure 2:
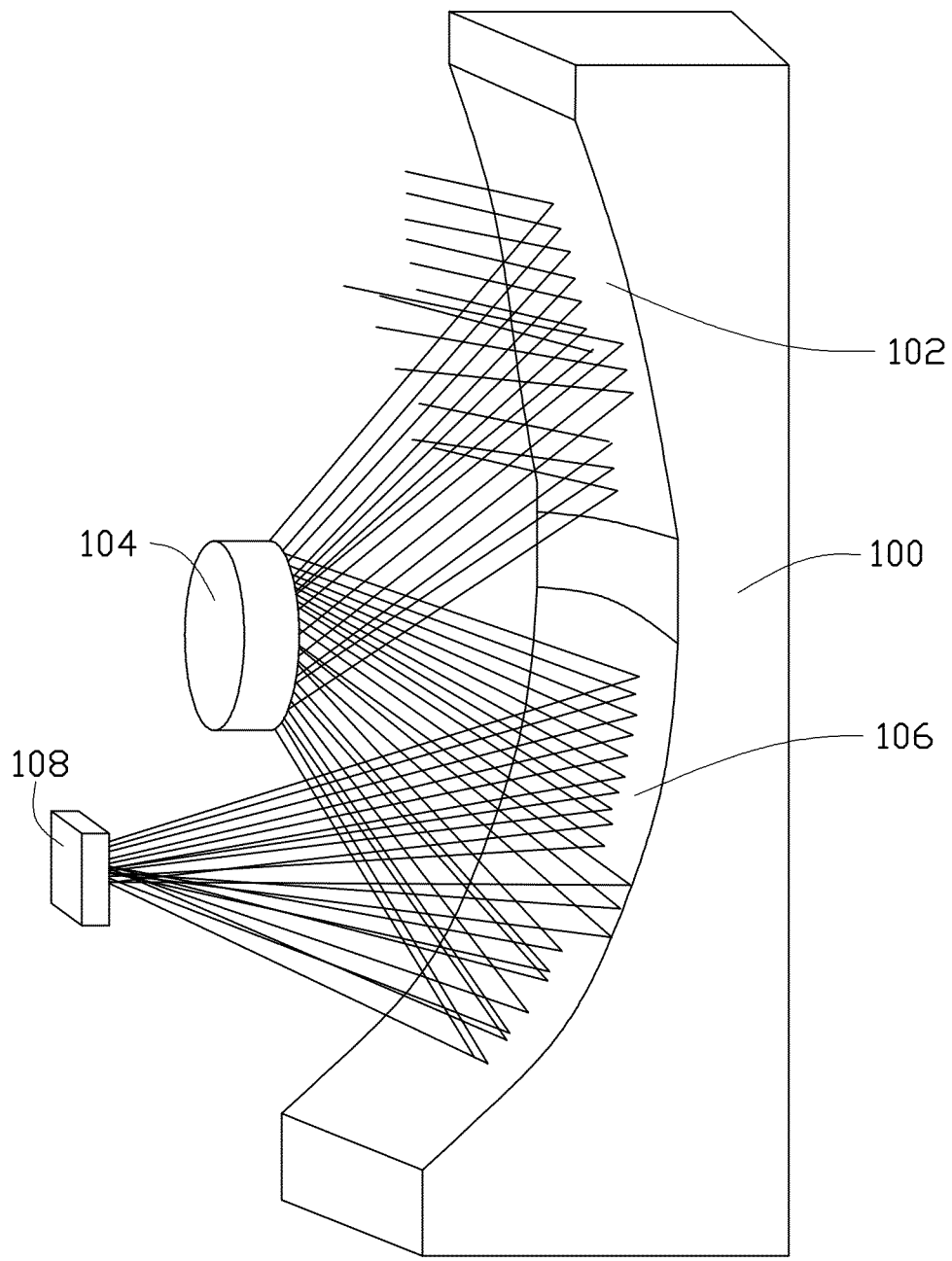
FIG. 2 is a schematic diagram of configuration of the off-axial three-mirror system in FIG. 1.

Referring to FIG. 1 and FIG. 2, an off-axial three-mirror system 10 of one embodiment includes a primary mirror 102, a secondary mirror 104, a tertiary mirror 106, and an image sensor 108. The secondary mirror 104 is located on a reflective optical path of the primary mirror 102. The tertiary mirror 106 is located on a reflective optical path of the secondary mirror 104. The image sensor 108 is located on a reflecting optical path of the tertiary mirror 106. The primary mirror 102 and the tertiary mirror 106 are formed as one piece. The surface type of the primary mirror 102 is freeform surface. The surface type of the tertiary mirror 106 is freeform surface also. The freeform surface of the primary mirror 102 and the tertiary mirror 106 introduces more degrees of freedom to the off-axial three-mirror system 10, which can be used to improve the performance and image quality of the whole system.

An optical path of the off-axial three-mirror system 10 of one embodiment can be depicted as follows. Firstly, an incident light reaches the primary mirror 102 and is reflected by the primary mirror 102. Secondly, the incident light reaches the secondary mirror 104 and is reflected by the secondary mirror 104. Thirdly, the incident light reaches the tertiary mirror 106 and is reflected by the tertiary mirror 106. Finally, the incident light is received by the image sensor 108.

The primary mirror 102 is a concave mirror as a whole. The tertiary mirror 106 is a concave mirror as a whole also.

According to one embodiment, the surface type of the primary mirror 102 is XY polynomial surface, and the surface type of the tertiary mirror 106 is XY polynomial surface also. The XY polynomial equation can be expressed as follows:

$$z = \frac{x^2 + y^2}{R(1 + \sqrt{1 - (1 + C_1)(x^2 + y^2)/R^2})} + C_2 x + C_3 y + C_4 x^2 + C_5 xy + C_6 y^2 + C_7 x^3 + C_8 x^2 y + C_9 xy^2 + C_{10} y^3 + C_{11} x^4 + C_{12} x^3 y + C_{13} x^2 y^2 + C_{14} xy^3 + C_{15} y^4.$$

R in the equation represents radius of the primary mirror 102 and the tertiary mirror 106, while $C_1 \sim C_{15}$ represent coefficients in the equation. The values of coefficients and R in the equation of the primary mirror 102 are listed in TABLE 1. The values of coefficients and R in the equation of the tertiary mirror 106 are listed in TABLE 2.

TABLE 1

| R | $C_1$ | $C_2$ | $C_3$ | $C_4$ | $C_5$ | $C_6$ | $C_7$ |
|---|---|---|---|---|---|---|---|
| 361.890 | −0.481 | −4.476 × 10$^{-7}$ | −4.904 × 10$^{-2}$ | −2.247 × 10$^{-3}$ | 1.690 × 10$^{-9}$ | −2.348 × 10$^{-3}$ | −1.374 × 10$^{-12}$ |
| $C_8$ | $C_9$ | $C_{10}$ | $C_{11}$ | $C_{12}$ | $C_{13}$ | $C_{14}$ | $C_{15}$ |
| 5.312 × 10$^{-7}$ | −3.204 × 10$^{-12}$ | 4.731 × 10$^{-7}$ | −1.724 × 10$^{-9}$ | 1.327 × 10$^{-14}$ | −3.698 × 10$^{-9}$ | 2.308 × 10$^{-14}$ | −2.122 × 10$^{-9}$ |

TABLE 2

| R | $C_1$ | $C_2$ | $C_3$ | $C_4$ | $C_5$ | $C_6$ | $C_7$ |
|---|---|---|---|---|---|---|---|
| −188.938 | 0.305 | $-3.908 \times 10^{-7}$ | $7.408 \times 10^{-2}$ | $2.620 \times 10^{-5}$ | $-1.176 \times 10^{-9}$ | $1.272 \times 10^{-4}$ | $-1.707 \times 10^{-12}$ |
| $C_8$ | $C_9$ | $C_{10}$ | $C_{11}$ | $C_{12}$ | $C_{13}$ | $C_{14}$ | $C_{15}$ |
| $7.241 \times 10^{-7}$ | $-6.562 \times 10^{-12}$ | $6.047 \times 10^{-7}$ | $1.591 \times 10^{-9}$ | $3.267 \times 10^{-14}$ | $2.011 \times 10^{-9}$ | $-6.012 \times 10^{-14}$ | $1.207 \times 10^{-9}$ |

According to other embodiments, the surface types of both the primary mirror 102 and the tertiary mirror 106 can be Zernike polynomial surface, Bezier surface, or NURBS surface.

The surface type of the secondary mirror 104 is not restricted. In one embodiment, the surface type of the secondary mirror 104 is aspherical surface. The equation of the aspherical surface can be expressed as follows:

$$z = \frac{x^2 + y^2}{R(1 + \sqrt{1 - (1 + C_1)(x^2 + y^2)/R^2})} + A(x^4 + 2x^2y^2 + y^4).$$

R in the equation represents radius of the secondary mirror 104, while $C_1$ and A represent coefficients in the equation. In one embodiment, R=−166.561, $C_1$=3.424, and A=1.956×$10^{-8}$.

The primary mirror 102 and the tertiary mirror 106 form a bulk structure 100. Once the bulk structure 100 is manufactured, the primary mirror 102 and the tertiary mirror 106 are also fabricated simultaneously. The design of the bulk structure 100 reduces the difficulty of assembling and aligning of the primary mirror 102 and the tertiary mirror 106. It also improves the precision of assembling and aligning of the primary mirror 102 and the tertiary mirror 106. In one embodiment, the surfaces of the primary mirror 102 and the tertiary mirror 106 extend smoothly on one surface of the bulk structure 100.

The materials of the primary mirror 102, the secondary mirror 104 and the tertiary mirror 106 can be aluminum, copper or other metals. The materials of the primary mirror 102, the secondary mirror 104 and the tertiary mirror 106 can also be silicon carbide, silicon oxide or other inorganic materials. A reflection enhancing coating can also be coated on said metals or inorganic materials to enhance the reflectivity performance of the three mirrors. In one embodiment, the primary mirror 102, the secondary mirror 104, and the tertiary mirror 106 are all made of aluminum. A gold film is coated on surface of the aluminum as a reflection enhancing coating.

The surface shape of both the primary mirror 102 and the tertiary mirror 106 is a rectangle while the surface shape of the secondary mirror 104 is a circle. In one embodiment, a size of the surface of the primary mirror 102 is 140 mm×140 mm. A size of the surface of the tertiary mirror 106 is 140 mm×120 mm. A diameter of the surface of the secondary mirror 104 is 55 mm.

A distance α between the primary mirror 102 and the secondary mirror 104 is in a range from 133 mm to 134 mm. A distance β between the secondary mirror 104 and the tertiary mirror 106 is also in a range from 133 mm to 134 mm. A distance γ between the tertiary mirror 106 and the image sensor 108 is also in a range from 133 mm to 134 mm. In one embodiment, the distance α, β, and γ are all 133.7 mm.

A space coordinates system is set in FIG. 1. An optical axis of the off-axial three-mirror system 10 is parallel to Z-axis of the space coordinates system. The primary mirror 102 and the secondary mirror 104 have no decentering and tilting in the space coordinates system respecting to the optical axis. The tertiary mirror 106 and the image sensor 108 have no decentering in the space coordinates system either. Define a direction θ in the space coordinates system and the direction θ represents a direction rotating from Z-axis to Y-axis. Both the tertiary mirror 106 and the image sensor 108 have a tilting angle along the direction θ in the space coordinates system respecting to the optical axis, wherein the tilting angle of the tertiary mirror 106 is 10° and the tilting angle of the image sensor 108 is −5.292°.

The image sensor 108 can be a charge-coupled device (CCD) type or a complementary metal-oxide semiconductor (CMOS) type. In one embodiment, a planar array CCD is employed as the image sensor 108. The size of the planar array CCD is 7.2 mm×9.6 mm.

The entrance pupil diameter (EPD) of the off-axial three-mirror system 10 is more than 60 mm. In one embodiment, the EPD of the off-axial three-mirror system 10 is 100 mm. Thus, the off-axial three-mirror system 10 is a large-EPD off-axial three-mirror system.

The field of view (FOV) of the off-axial three-mirror system 10 is 3°×4°.

The effective focal length (EFL) of the off-axial three-mirror system 10 is −136.719 mm.

Figure 3:
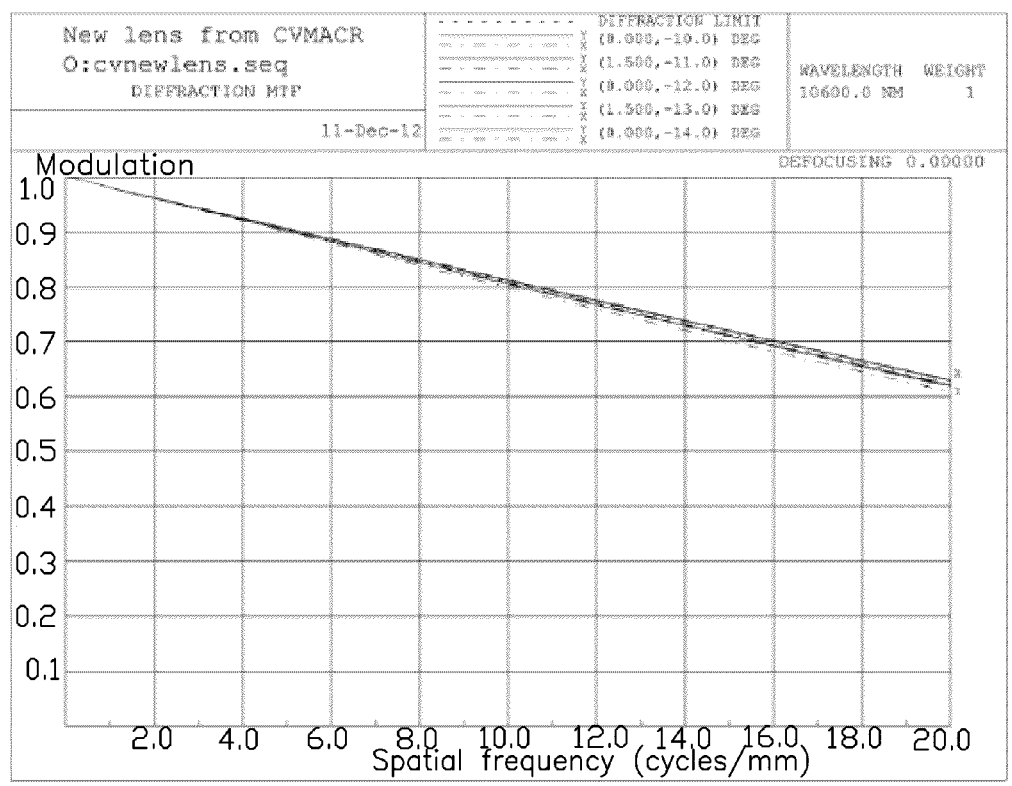
FIG. 3 is a plot of modulation transfer function of the off-axial three-mirror system in FIG. 1.

A plot of modulation transfer function (MTF) of the off-axial three-mirror system 10 of one embodiment is shown in FIG. 3. The MTF of the off-axial three-mirror system 10 is higher than 0.6 at 20 cycles/mm, close to the diffraction limit.

Figure 4:
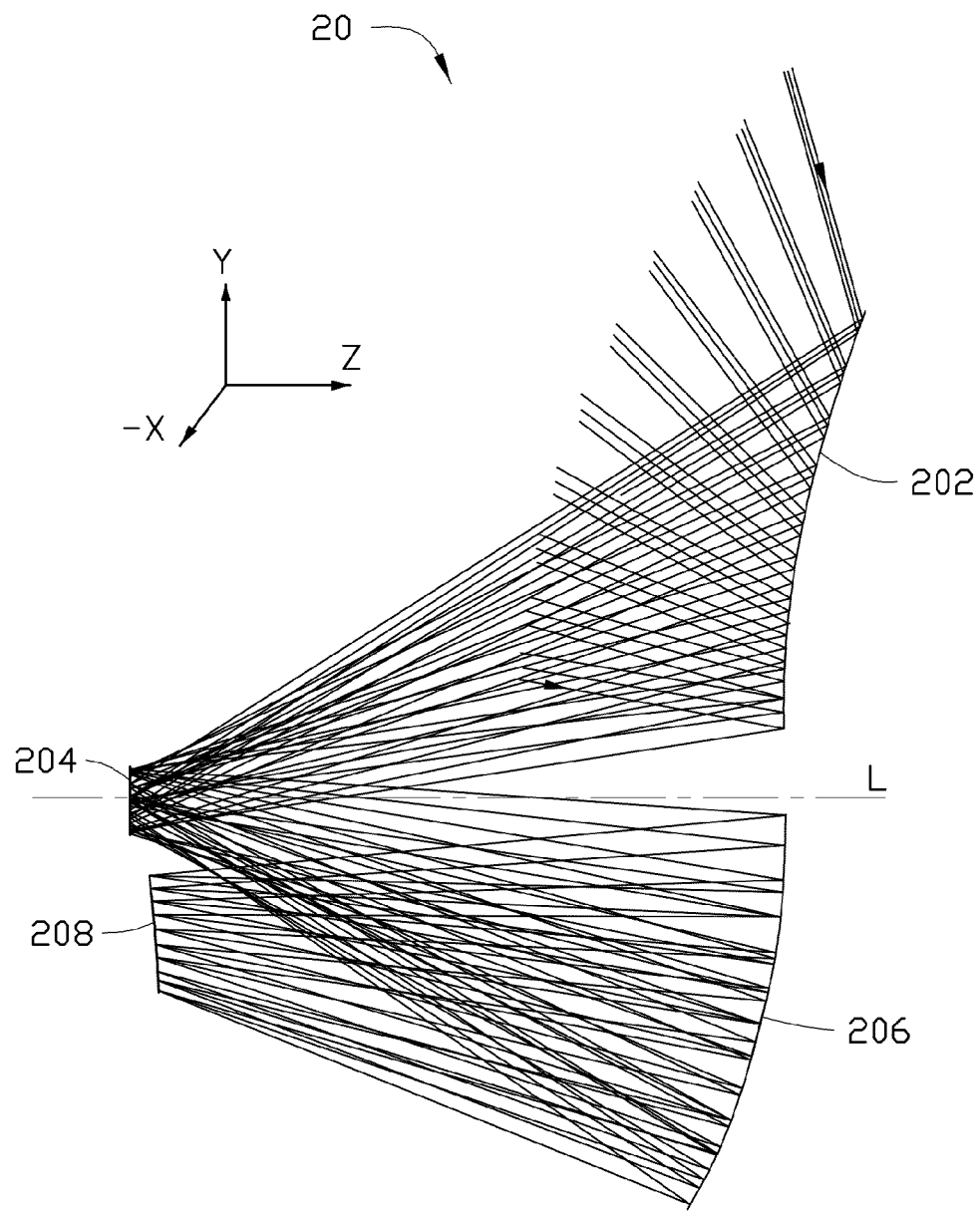
FIG. 4 is a diagram of optical path of an off-axial three-mirror system according to another embodiment.
Figure 5:
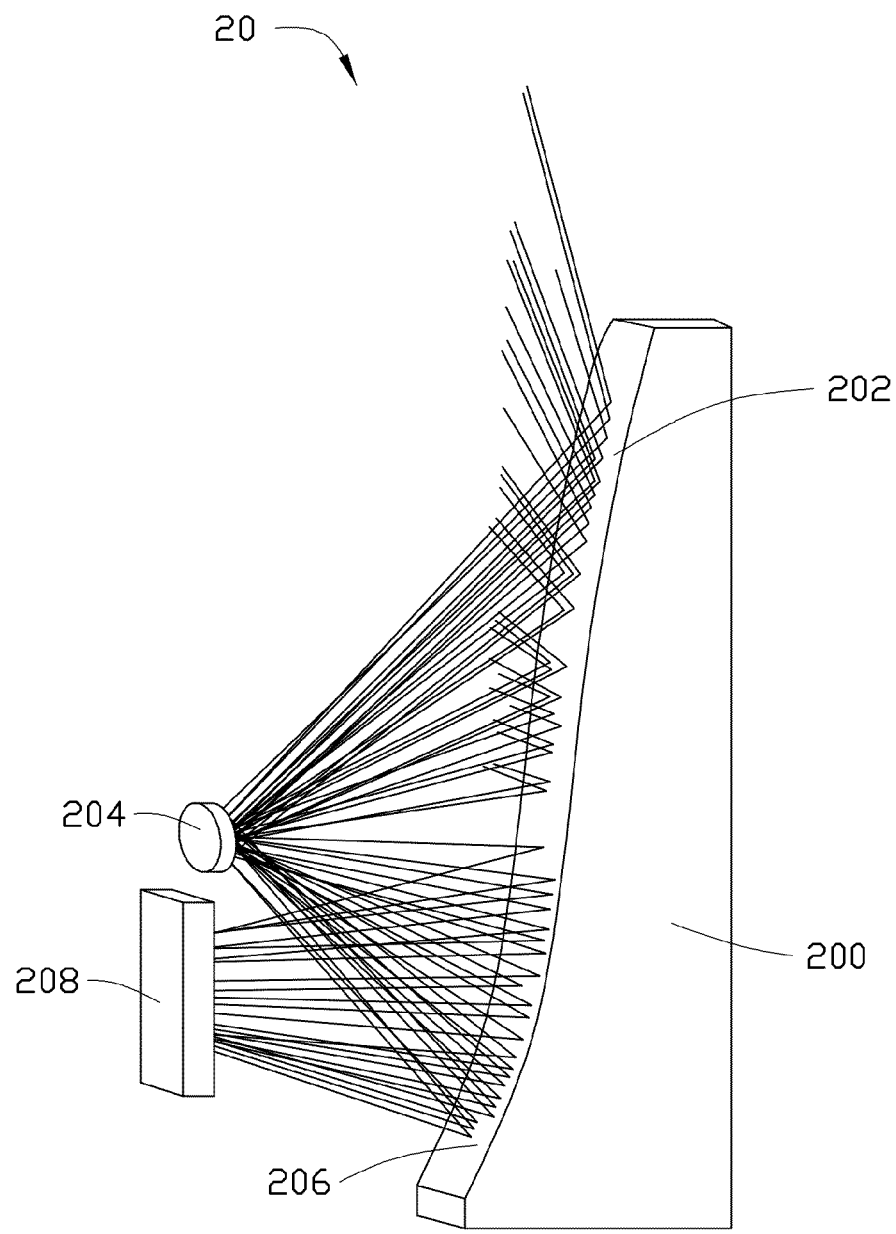
FIG. 5 is a schematic diagram of configuration of the off-axial three-mirror system in FIG. 4.

Referring to FIG. 4 and FIG. 5, an off-axial three-mirror system 20 of another embodiment includes a primary mirror 202, a secondary mirror 204, a tertiary mirror 206, and an image sensor 208. The secondary mirror 204 is located on a reflective optical path of the primary mirror 202. The tertiary mirror 206 is located on a reflective optical path of the secondary mirror 204. The image sensor 208 is located on a reflecting optical path of the tertiary mirror 206. The primary mirror 202 and the tertiary mirror 206 are formed as one piece. The surface type of the primary mirror 202 is freeform surface. The surface type of the tertiary mirror 206 is freeform surface also. The freeform surface of the primary mirror 202 and the tertiary mirror 206 introduces more degrees of freedom to the off-axial three-mirror system 20, which can be used to improve the performance and image quality of the whole system.

An optical path of the off-axial three-mirror system 20 of one embodiment can be depicted as follows. Firstly, an incident light reaches the primary mirror 202 and is reflected by the primary mirror 202. Secondly, the incident light reaches the secondary mirror 204 and is reflected by the secondary mirror 204. Thirdly, the incident light reaches the tertiary mirror 206 and is reflected by the tertiary mirror 206. Finally, the incident light is received by the image sensor 208.

The primary mirror 202 is a convex mirror as a whole. The tertiary mirror 206 is a concave mirror as a whole.

According to one embodiment, the surface type of the primary mirror 202 is XY polynomial surface, and the surface type of the tertiary mirror 206 is XY polynomial surface also. The XY polynomial equation can be expressed as follows:

$$z = \frac{x^2 + y^2}{R(1 + \sqrt{1 - (1 + C_1)(x^2 + y^2)/R^2})} + C_2 x +$$
$$C_3 y + C_4 x^2 + C_5 xy + C_6 y^2 + C_7 x^3 + C_8 x^2 y + C_9 xy^2 +$$
$$C_{10} y^3 + C_{11} x^4 + C_{12} x^3 y + C_{13} x^2 y^2 + C_{14} xy^3 + C_{15} y^4.$$

R in the equation represents radius of the primary mirror 202 and the tertiary mirror 206, while $C_1 \sim C_{15}$ represent coefficients in the equation. The values of coefficients and R in the equation of the primary mirror 202 are listed in TABLE 3. The values of coefficients and R in the equation of the tertiary mirror 206 are listed in TABLE 4.

TABLE 3

| R | $C_1$ | $C_2$ | $C_3$ | $C_4$ | $C_5$ | $C_6$ | $C_7$ |
|---|---|---|---|---|---|---|---|
| 358.016 | −0.366 | $5.790 \times 10^{-2}$ | $6.188 \times 10^{-2}$ | $1.088 \times 10^{-3}$ | $8.842 \times 10^{-5}$ | $2.318 \times 10^{-4}$ | $-8.609 \times 10^{-7}$ |
| $C_8$ | $C_9$ | $C_{10}$ | $C_{11}$ | $C_{12}$ | $C_{13}$ | $C_{14}$ | $C_{15}$ |
| $1.343 \times 10^{-7}$ | $2.578 \times 10^{-7}$ | $9.240 \times 10^{-7}$ | $-4.185 \times 10^{-8}$ | $1.235 \times 10^{-8}$ | $-9.941 \times 10^{-9}$ | $-9.248 \times 10^{-12}$ | $-7.091 \times 10^{-9}$ |

TABLE 4

| R | $C_1$ | $C_2$ | $C_3$ | $C_4$ | $C_5$ | $C_6$ | $C_7$ |
|---|---|---|---|---|---|---|---|
| −241.763 | 0.430 | $-1.655 \times 10^{-2}$ | $4.061 \times 10^{-2}$ | $4.056 \times 10^{-5}$ | $-9.874 \times 10^{-6}$ | $-8.263 \times 10^{-5}$ | $-3.297 \times 10^{-7}$ |
| $C_8$ | $C_9$ | $C_{10}$ | $C_{11}$ | $C_{12}$ | $C_{13}$ | $C_{14}$ | $C_{15}$ |
| $3.963 \times 10^{-7}$ | $-1.295 \times 10^{-7}$ | $3.713 \times 10^{-7}$ | $4.014 \times 10^{-9}$ | $2.517 \times 10^{-9}$ | $3.940 \times 10^{-9}$ | $2.192 \times 10^{-10}$ | $1.971 \times 10^{-10}$ |

According to other embodiments, the surface types of both the primary mirror 202 and the tertiary mirror 206 can be Zernike polynomial surface, Bezier surface, or NURBS surface.

The surface type of the secondary mirror 204 is not restricted. In one embodiment, the surface type of the secondary mirror 204 is aspherical surface. The equation of the aspherical surface can be expressed as follows:

$$z = \frac{r^2}{R(1 + \sqrt{1 - (1 + K)r^2/R^2})} + Ar^4 + Br^6 + Cr^8 + Dr^{10}.$$

In the equation, $r = \sqrt{x^2 + y^2}$, R represents radius of the secondary mirror 204, while K and A~D represent coefficients in the equation. In one embodiment, the values of coefficients and R in the equation of the secondary mirror 204 are listed in TABLE 5.

TABLE 4

| R | K | A | B | C | D |
|---|---|---|---|---|---|
| −478.425 | 143.657 | $9.263 \times 10^{-8}$ | $5.907 \times 10^{-10}$ | $-7.450 \times 10^{-12}$ | $3.036 \times 10^{-14}$ |

The primary mirror 202 and the tertiary mirror 206 form a bulk structure 200. Once the bulk structure 200 is manufactured, the primary mirror 202 and the tertiary mirror 206 are also fabricated simultaneously. The design of the bulk structure 200 reduces the difficulty of assembling and aligning of the primary mirror 202 and the tertiary mirror 206. It also improves the precision of assembling and aligning of the primary mirror 202 and the tertiary mirror 206. In one embodiment, the surfaces of the primary mirror 202 and the tertiary mirror 206 extend smoothly on one surface of the bulk structure 200.

The materials of the primary mirror 202, the secondary mirror 204 and the tertiary mirror 206 can be aluminum, copper or other metals. The materials of the primary mirror 202, the secondary mirror 204 and the tertiary mirror 206 can also be silicon carbide, silicon oxide or other inorganic materials. A reflection enhancing coating can also be coated on said metals or inorganic materials to enhance the reflection performance of the three mirrors. In one embodiment, the primary mirror 202, the secondary mirror 204, and the tertiary mirror 206 are all made of aluminum. A gold film is coated on surface of the aluminum as a reflection enhancing coating.

The surface shape of both the primary mirror 202 and the tertiary mirror 206 is a rectangle while the surface shape of the secondary mirror 204 is a circle. In one embodiment, a size of the surface of the primary mirror 202 is 200 mm×14 mm. A size of the surface of the tertiary mirror 206 is 140 mm×22 mm. A diameter of the surface of the secondary mirror 204 is 12 mm.

A distance μ between the primary mirror 202 and the secondary mirror 204 is in a range from 185.5 mm to 186.5 mm. A distance ν between the secondary mirror 204 and the tertiary mirror 206 is also in a range from 185.5 mm to 186.5 mm. A distance σ between the tertiary mirror 206 and the image sensor 208 is in a range from 181.0 mm to 182.0 mm. In one embodiment, the distance μ and ν are both 186.078 mm and the distance σ is 181.604.

A space coordinates system is set in FIG. 4. An optical axis of the off-axial three-mirror system 20 is parallel to Z-axis of the space coordinates system. The primary mirror 202 and the secondary mirror 204 have no decentering and tilting in the space coordinates system respecting to the optical axis. The tertiary mirror 206 and the image sensor 208 have no decentering in the space coordinates system either. Define a direction φ in the space coordinates system and the direction φ represents a direction rotating from Z-axis to Y-axis. Both the tertiary mirror 206 and the image sensor 208 have a tilting angle along the direction φ in the space coordinates system respecting to the optical axis, wherein the tilting angle of the tertiary mirror 206 is 4° and the tilting angle of the image sensor 208 is 2.09°.

The image sensor 208 can be a CCD type or a CMOS type. In one embodiment, a linear array CCD is employed as the image sensor 208. The size of the linear array CCD is 51 mm.

The FOV of the off-axial three-mirror system 20 is more than 45°. In one embodiment, the FOV of the off-axial three-mirror system 20 is 64°. Thus, the off-axial three-mirror system 20 is a wide-FOV off-axial three-mirror system.

The EPD of the off-axial three-mirror system 20 is between 5 mm to 10 mm. In one embodiment, the EPD of the off-axial three-mirror system 20 is 7.5 mm.

The EFL of the off-axial three-mirror system 20 is −44.794 mm.

Figure 6:
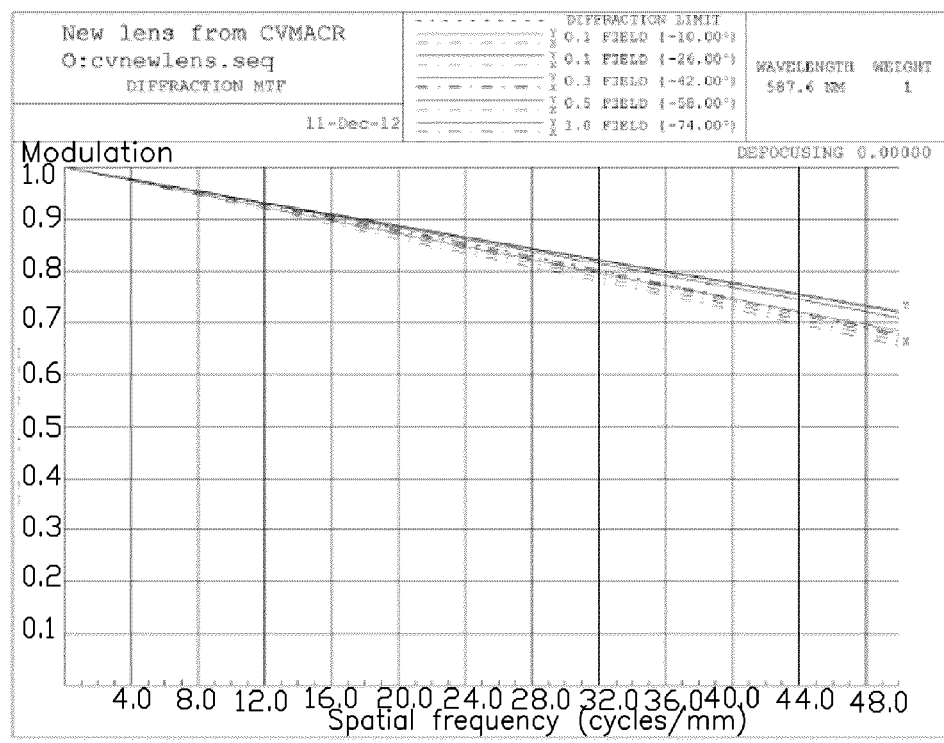
FIG. 6 is a plot of modulation transfer function of the off-axial three-mirror system in FIG. 4.

A plot of modulation transfer function (MTF) of the off-axial three-mirror system 20 of one embodiment is shown in FIG. 6. The MTF of the off-axial three-mirror system 20 is higher than 0.6 at 48 cycles/mm, close to the diffraction limit.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. An off-axial three-mirror system comprising: a primary mirror, a secondary mirror, a tertiary mirror, and an image sensor; wherein the secondary mirror is located on a primary mirror reflective optical path, the tertiary mirror is located on a secondary mirror reflective optical path, the image sensor is located on a tertiary mirror reflecting optical path; the primary mirror and the tertiary mirror are formed as one piece, a surface type of both the primary mirror and the tertiary mirror is a freeform surface; the primary mirror is a convex mirror; and the tertiary mirror is a concave mirror.

2. The system as claimed in claim 1, wherein the surface type of both the primary mirror and the tertiary mirror is a XY polynomial surface.

3. The system as claimed in claim 2, wherein an equation of the XY polynomial surface is $$z = \frac{x^2 + y^2}{R(1 + \sqrt{1 - (1 + C_1)(x^2 + y^2)/R^2})} + C_2 x + C_3 y + C_4 x^2 + C_5 xy + C_6 y^2 + C_7 x^3 + C_8 x^2 y + C_9 xy^2 + C_{10} y^3 + C_{11} x^4 + C_{12} x^3 y + C_{13} x^2 y^2 + C_{14} xy^3 + C_{15} y^4.$$

R in the equation represents radius of the primary mirror and the tertiary mirror, and $C_1$~$C_{15}$ represent coefficients in the equation.

4. The system as claimed in claim 3, wherein R=358.016, $C_1$=−0.366, $C_2$=5.790×10⁻², $C_3$=6.188×10⁻², $C_4$=1.088×10⁻³, $C_5$=8.842×10⁻⁵, $C_6$=2.318×10⁻⁴, $C_7$=−8.609×10⁻⁷, $C_8$=1.343×10⁻⁷, $C_9$=2.578×10⁻⁷, $C_{10}$=9.240×10⁻⁷, $C_{11}$=−4.185×10⁻⁸, $C_{12}$=1.235×10⁻⁸, $C_{13}$=−9.941×10⁻⁹, $C_{14}$=−9.248×10⁻¹², $C_{15}$=−7.091×10⁻⁹ in the equation of the primary mirror.

5. The system as claimed in claim 3, wherein R=−241.763, $C_1$=0.430, $C_2$=−1.655×10⁻², $C_3$=4.061×10⁻², $C_4$=4.056×10⁻⁵, $C_5$=−9.874×10⁻⁶, $C_6$=−8.263×10⁻⁵, $C_7$=−3.297×10⁻⁷, $C_8$=3.963×10⁻⁷, $C_9$=−1.295×10⁻⁷, $C_{10}$=3.713×10⁻⁷, $C_{11}$=4.014×10⁻⁹, $C_{12}$=2.517×10⁻⁹, $C_{13}$=3.940×10⁻⁹, $C_{14}$=2.192×10⁻¹⁰, $C_{15}$=1.971×10⁻¹⁰ in the equation of the tertiary mirror.

6. The system as claimed in claim 2, wherein an entrance pupil diameter of the off-axial three-mirror system is 7.5 mm.

7. The system as claimed in claim 1, wherein a surface type of the secondary mirror is an aspherical surface, an equation of the aspherical surface is $$z = \frac{r^2}{R(1 + \sqrt{1 - (1 + K)r^2/R^2})} + Ar^4 + Br^6 + Cr^8 + Dr^{10},$$

$r=\sqrt{x^2+y^2}$ in the equation, R represents radius of the secondary mirror, and K and A~D represent coefficients in the equation.

8. The system as claimed in claim 7, wherein R=−478.425, K=143.657, A=9.263×10⁻⁸, B=5.907×10⁻¹⁰, C=−7.450×10⁻¹², D=3.036×10⁻¹⁴ in the equation.

9. The system as claimed in claim 1, wherein the primary mirror, the secondary mirror, and the tertiary mirror are all made of aluminum, and a gold film is coated on surface of the aluminum.

10. The system as claimed in claim 1, wherein μ is defined as a distance between the primary mirror and the secondary mirror, ν is defined as a distance between the secondary mirror and the tertiary mirror, σ is defined as a distance between the tertiary mirror and the image sensor; μ and ν are both in a range from 185.5 mm to 186.5 mm, and σ is in a range from 181.0 mm to 182.0 mm.

11. The system as claimed in claim 10, wherein μ and ν are both 186.078 mm, and σ is 181.604 mm.

12. The system as claimed in claim 1, wherein an optical axis is defined in the off-axial three-mirror system, the primary mirror and the secondary mirror have no decentering and tilting respective to the optical axis, the tertiary mirror has a tilting angle of 4° respective to the optical axis, and the image sensor has a tilting angle of 2.09° respective to the optical axis.

13. The system as claimed in claim 1, wherein the image sensor is a linear array charge-coupled device.

14. The system as claimed in claim 13, wherein a field of view of the off-axial three-mirror system is more than 45°.

15. The system as claimed in claim 13, wherein a field of view of the off-axial three-mirror system is 64°.

16. The system as claimed in claim 15, wherein an effective focal length of the off-axial three-mirror system is −44.794 mm.

17. The system as claimed in claim 1, wherein an entrance pupil diameter of the off-axial three-mirror system is between 5 mm to 10 mm.

18. The system as claimed in claim 1, wherein the primary mirror and the tertiary mirror form a bulk structure, and surfaces of the primary mirror and the tertiary mirror extend smoothly on a surface of the bulk structure.

19. The system as claimed in claim 1, wherein an optical path of the off-axial three-mirror system is defined as follows: an incident light reaches the primary mirror and is reflected by the primary mirror, and then reaches the secondary mirror and is reflected by the secondary mirror, and then reaches the tertiary mirror and is reflected by the tertiary mirror, and is finally received by the image sensor.

* * * * *